United States Patent
Pan

(10) Patent No.: US 6,459,844 B1
(45) Date of Patent: Oct. 1, 2002

(54) TUNABLE FIBER OPTIC FILTER

(75) Inventor: Jing-Jong Pan, Milpitas, CA (US)

(73) Assignee: JDS Uniphase Corporation, Ottawa (CA)

( * ) Notice: Subject to any disclaimer, the term of this patent is extended or adjusted under 35 U.S.C. 154(b) by 0 days.

(21) Appl. No.: 09/351,641

(22) Filed: Jul. 13, 1999

Related U.S. Application Data

(60) Provisional application No. 60/106,489, filed on Oct. 30, 1998.

(51) Int. Cl.[7] .............................. G02B 6/00; G02B 27/00
(52) U.S. Cl. ........................................ 385/140; 359/578
(58) Field of Search ................................. 385/140, 147, 385/33, 34, 11, 27, 31, 36; 372/15, 20, 32, 99; 359/245, 589, 885, 889, 890

(56) References Cited

U.S. PATENT DOCUMENTS

| | | |
|---|---|---|
| 3,387,531 A | 6/1968 | Hesse |
| 4,591,231 A | 5/1986 | Kaiser et al. ............. 350/96.18 |
| 4,702,549 A | 10/1987 | Duck et al. |
| 4,813,756 A | 3/1989 | Frenkel et al. ........... 350/96.18 |
| 4,861,136 A | 8/1989 | Stone et al. |
| 4,904,044 A | 2/1990 | Tamulevich ............. 350/96.18 |
| 5,287,214 A | 2/1994 | Robertson et al. |
| 5,297,155 A | 3/1994 | Pan et al. |
| 5,331,651 A | 7/1994 | Becker et al. |
| 5,416,867 A | 5/1995 | Thorston et al. ............... 385/73 |
| 5,506,731 A | 4/1996 | Smiley |
| 5,781,341 A | 7/1998 | Lee |
| 5,784,507 A | 7/1998 | Holm-Kennedy et al. .... 385/31 |
| 5,799,121 A | 8/1998 | Duck et al. |
| 5,889,904 A * | 3/1999 | Pan et al. ...................... 385/24 |
| 5,900,983 A | 5/1999 | Ford et al. |
| 6,130,984 A * | 10/2000 | Shen et al. .................. 385/140 |

OTHER PUBLICATIONS

R. Wyatt et al., "10 kHz linewidth 1.5μm InGaAsP External cavity laser with 55 nm tuning range," *Electronics Letters*, 19(3):110–112 (1983).

\* cited by examiner

*Primary Examiner*—Frank G. Font
*Assistant Examiner*—Layla Lauchman
(74) *Attorney, Agent, or Firm*—Lacasse & Associates, LLC

(57) ABSTRACT

The invention provides improved optical devices, systems, and methods for controllably varying an optical characteristic of an optical signal, particularly for filtering and generating optical signals about a narrow tunable central wavelength. Thin film multi-cavity Fabry-Perot bandpass filters have film thicknesses which vary so as to vary the center wavelength of the filter's pass range. Novel micro lenses and lens arrangements avoid transmission of optical signals through a large area of the optical filter, which would widen the effective pass bandwidth and reduce coupling efficiency. These bandpass filtering techniques can be used in an external cavity laser system to provide a tunable laser source.

26 Claims, 4 Drawing Sheets

TUNABLE FIBER OPTIC FILTER

CROSS REFERENCE TO RELATED APPLICATIONS

This application claims the benefit of priority from U.S. Provisional Patent Application Serial No. 60/106,489, filed Oct. 30, 1998, the full disclosure of which is incorporated herein by reference.

BACKGROUND OF THE INVENTION

The present invention is related to the field of optical communications and fiber optic networks, and more particularly, provides variable wavelength optical filters for use in tunable laser sources, dense wavelength-division multiplexed systems, and the like.

Variable wavelength devices have a variety of uses in optical systems. One particularly useful variable wavelength device is the tunable laser source. Tunable laser sources often include an external cavity Fabry-Perot laser diode chip in which one end face includes an anti-reflective coating. A wavelength selective reflector is positioned adjacent the coated end face. The wavelength selective reflector is typically a diffractive grating, which may be ruled or holographically made. These reflectors are essentially mirrors with very narrow bandwidths in the wavelength domain. Only a limited portion of the wavelength spectrum is returned to the Fabry-Perot laser diode, and the diode only resonates at the reflected wavelength. By using a wavelength selective reflector which is tunable, the external cavity Fabry-Perot laser diode can be forced to resonate at varying wavelengths, thereby providing a tunable laser source. An exemplary known tunable laser assembly is described in U.S. Pat. No. 5,297,155, the full disclosure of which is incorporated herein by reference.

One way to vary the wavelength of a selective reflector is to rotate a reflective grating so as to change the angle of incidence. This changes the effective period of the grating, and hence the reflected wavelength. Microstepping motors may be used to accurately control the angular position of a grating by directly attaching the grating to the motor output shaft. Although this approach is quite straightforward, resolution and accuracy are limited. High precision microstepping motors may have over 50,000 steps, which still gives an angular resolution of over half a minute. Additionally, angular position errors accumulate during repositioning of a stepper motor. As a result, the wavelength adjustability of the grating is limited, and frequent homing of the microstepper motor is required. Additionally, limiting the bandwidth of a reflective grating to the small ranges desired for dense wavelength-division multiplex systems can be quite difficult. This could lead to mode-hopping problems between signals of adjacent frequencies, so that an etalon is often inserted into the optical path to more cleanly select the desired wavelengths.

It is known to use very different filtering structures for other filtering applications. For example, multi-cavity Fabry-Perot resonators are often built up from multiple thin film coatings to act as bandpass filters. Rather than reflecting a selective bandwidth, such bandpass filters pass a narrow bandwidth distributed about a center wavelength. Manufacturers of thin film bandpass filters generally strive to provide uniform coating thicknesses across the substrate so as to provide a uniform central wavelength. However, specialized bandpass filters having varying coating thicknesses are commercially available from Optical Coating Laboratory, Inc. of Santa Rosa, Calif. under the trademark Selectra-brand™. These variable wavelength filters allow, for example, selection of a specific wavelength within the visual wavelength region by adjusting the filter to an appropriate position when mounting the filter to a detector array package. This can allow a selected portion of the visible spectrum to be scanned electronically.

Co-pending application Ser. No. 09/013,803, filed Jan. 26, 1998 (the full disclosure of which is incorporated herein by reference) describes a structure and method for tuning thin film bandpass filters by varying an angle of incidence of an optical signal directed at the filter. Although this technique allows very fine adjustments of the central bandwidth of the thin film optical filter, polarization dependent loss of the optical signal can be significant when the incident angle is large. Additionally, it may be difficult to control and measure the angle of incidence of light upon the filter when varying the central wavelength after assembly is complete.

In light of the above, it would be desirable to provide improved optical devices, systems, and methods. It would further be desirable to provide improved techniques for filtering and generation of optical signals, particularly for use in dense wavelength division multiplex systems. It would be especially desirable if these improved techniques allowed highly accurate and controllable filtering of optical signals for use in tunable laser sources and other applications within fiber optic networks.

SUMMARY OF THE INVENTION

The present invention provides improved optical devices, systems, and methods for controllably varying an optical characteristic of an optical signal, particularly for filtering and generating narrow bandwidth optical signals about a tunable central wavelength. These techniques preferably make use of thin film multi-cavity Fabry-Perot bandpass filters in which the film thicknesses vary so as to vary the center wavelength of the filter's pass range. To avoid transmission of optical signals through a large area of the optical filter (which would widen the effective pass bandwidth and reduce coupling efficiency by transmitting optical signals through portions of the filter having differing central wavelengths), the invention provides novel fiber-based lenses and lens arrangements. Advantageously, these bandpass filtering techniques can be used in an external cavity laser system to provide a tunable laser source.

In a first aspect, the present invention provides a device for varying a wavelength of an optical signal. The device comprises a first optical fiber disposed along an optical path. An optical filter selectively transmits signals within a pass wavelength range. The pass range of the filter varies from a first pass range at a first region of the filter, to a second pass range at a second region of the filter. A filter moving mechanism is coupled to the filter so that an aligned region of the filter in the optical path moves between the first and second regions. The aligned filter region has an effective pass wavelength range. An electrical component is coupled to the mechanism so as to indicate the effective pass wavelength range.

The central pass frequency of the filter will preferable vary substantially linearly along a filter axis. This allows a threaded filter moving mechanism to accurately position the filter, particularly when the filter is supported by a linear ball slide. Although stepper motors may optionally be used, the electrical component will preferably provide a signal which indicates the absolute position (and hence the absolute bandpass range) of the filter, thereby allowing the use of less expensive motors while providing greater long-term accuracy.

In another aspect, the invention provides a device for varying an optical characteristic of an optical signal. The device comprises an input optical fiber for transmitting the optical signal. The input fiber has an end, and an optical filter is found in an optical path of the optical signal. The filter selectively passes a portion of the optical signal. An output fiber is disposed in the optical path of the passed portion of the optical signal. At least one lens is disposed in the optical path between the input fiber and the output fiber. The at least one lens has a diameter which is not substantially larger than a diameter of the input or output fiber.

In some embodiments, expanded fiber cores adjacent the ends of the input and output fibers will act as lenses to enhance coupling efficiency. When using expanded fiber core lenses, the separation distance between the expanded cores will preferable be less than about one (1) mm, and will ideally be no more than about five hundred (500) µm. In other embodiments, a length of GRIN multi-mode fiber adjacent the end of a single mode input or output fiber may be used as a lens. The length of the GRIN multi-mode fiber will preferably be such that optical signals transmitted from the end of the single mode fiber and through the lens are focused to a waist adjacent the filter.

In yet another aspect, the present invention provides an optical device comprising first and second optical fibers having ends disposed along an optical path. The ends are separated by a distance. A thin film optical element is disposed across the optical path between the ends of the optical fibers. A substrate supports the thin film optical element. The substrate has an opening, the opening receiving the end of the first optical fiber so as to diminish the separation distance.

In yet another aspect, the invention provides an optical fiber lens system comprising a single mode optical fiber having an end. A lens is disposed co-axially with the single mode fiber. The lens comprises a length of multi-mode fiber such that any signals transmitted from the fiber and through the lens are focused toward a waist disposed beyond the lens.

In yet another aspect, the invention provides a variable bandpass filter comprising a substrate having a first major surface and a plurality of coatings disposed on the first surface. The coatings selectively transmit light signals through the substrate within a pass wavelength range having a central wavelength. At least one of the coating thicknesses varies along a line between a first region and a second region.

In yet another aspect, the invention provides a tunable laser source comprising a laser diode and a reflector disposed along an optical path from the laser diode. The reflector is positioned so as to define an external laser cavity between the laser diode and the reflector. A bandpass filter is disposed along this external cavity. The filter has a pass range. A filter varying mechanism is coupled to the filter to vary the pass range of the filter from a first pass range to a second pass range.

DESCRIPTION OF THE SPECIFIC EMBODIMENTS

Figure 1:
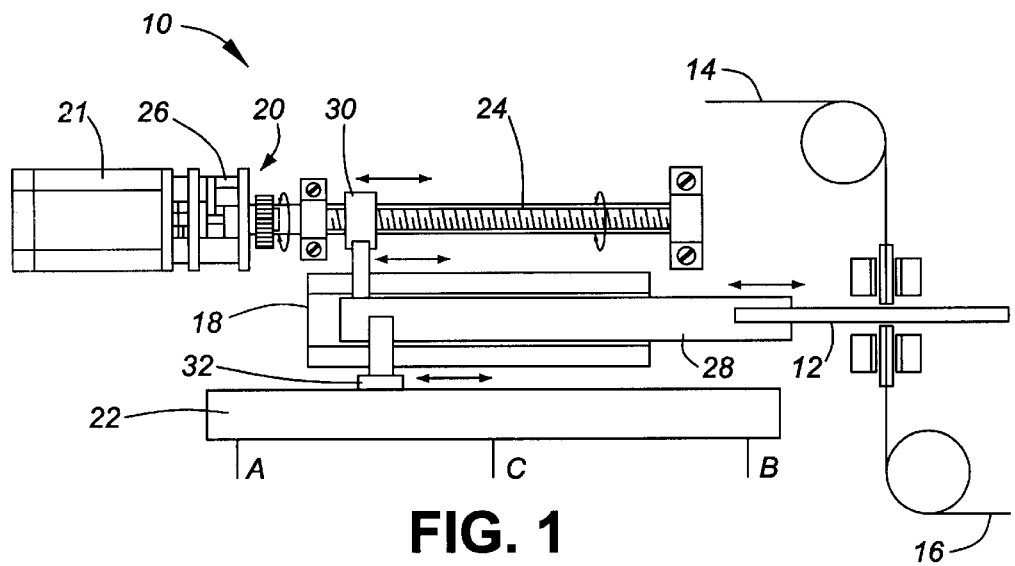
FIG. 1 illustrates a filtering system in which a threaded mechanism varies a central bandpass wavelength by moving a variable thickness bandpass filter within an optical path. The wiper of a potentiometer moves with the filter so as to generate an electrical signal indicating the filtering characteristics.

Referring now to FIG. 1, a variable bandpass filter system 10 includes a variable bandpass filter 12 disposed between a first or input fiber 14 and a second or output fiber 16. While these optical fibers will generally be referred to as an input fiber and an output fiber, it should be understood that optical signals may be transmitted in either direction between the first and second fibers, or may be transmitted in both directions, sequentially or simultaneously.

Variable filter 12 is generally supported by a ball slide 18. Variable filter 12 will typically be a substantially planer structure, and ball slide 18 supports the filter so that the filter is movable along its plane. A filter moving mechanism 20 is mechanically coupled to variable filter 12 via ball slide 18, and a potentiometer 22 is, in turn, coupled to the ball slide so that a resistance of the potentiometer varies with the axial position of filter 12.

Filter moving mechanism 20 includes a motor 21 coupled to a lead screw 24 by a gear drive 26. Motor 21 preferably comprises a relatively low cost, miniature D.C. electric motor, which may be driven continuously or in a step mode. Gear drive 26 is coupled to an output shaft of motor 21, the gear drive having a gear ratio which results in a reduced speed of rotation for lead screw 24 relative to the output shaft of the motor. Miniature geared motors, including both motor 21 and gear drive 26, are commercially available from a variety of sources. This exemplary motor is driven by a 4.5 volt continuous or pulsed power supply. The gear drive has a ratio of 1:298 so as to proved a rated speed of 40 rpm.

A slide 28 of ball slide 18 is attached to lead screw 24 by a nut 30 so that rotation of the lead screw relative to the nut causes axial displacement of ball slide. In the exemplary embodiment, lead screw 24 has 80 threads per inch, which provide a linear displacement speed of 212 µm per second.

While motor 21 may optionally comprise a stepper motor having a uniform step size, the exemplary moving mechanism uses a less expensive D.C. motor driven in pulse mode. As this may result in non-uniform steps, counting the number of drive pulses may not accurately indicate the linear position of variable filter 12 relative to input and output fiber 14, 16. Fortunately, by affixing a wiper 32 of potentiometer 22 to slide 28, the potentiometer can provide an absolute signal which accurately indicates the axial position of variable filter 12. As motor 21 may be driven in step mode at about 400 steps per turn, this allows a resolution of about 0.79 μm per step. Driving motor 21 with a somewhat longer electrical pulse of about 10 ms gives about 150 steps per turn, providing a step axial displacement of about 2 μm per pulse. Generally, when driven in pulse mode, moving mechanism 20 will effect a linear displacement of variable filter 12 of about 10 μm per pulse or less, ideally being less than about 5 μm per pulse.

Ball slide 18 helps maintain alignment of variable filter 12 in the optical path by limiting the filter to movement parallel to an axis of the lead screw, the movement also being in the plane of the filter. Such ball slides are widely commercially available.

When using a linear displacement filter moving mechanism, potentiometer 22 preferably comprises a linear potentiometer. The wiper displacement range should at least match the desired movement range of ball slide 18 used to effect the full range of bandpass variability. When using a simple linear mechanism, this will generally mean that the ball slide and the wiper displacement range are at least as long as the distance between the minimum and maximum desired frequency ranges on variable filter 12. Alignment of potentiometer 22, ball slide 18, and filter moving mechanism 20 is enhanced by affixing a body of the potentiometer, fixed portion of the ball slide, and the bearings supporting lead screw 24 to a common support structure such as a base plate parallel to the drawing plane of FIG. 1. As wiper 32 is affixed to slide 28, the electrical potential of potentiometer 22 will accurately indicate the region of variable filter 12 aligned between input fiber 14 and output fiber 16.

It should be understood that a wide variety of alternative moving mechanisms, filter support structures, and electrical components may be substituted for the exemplary structure of filter system 10. For example, motor 21 may drivingly engage nut 30, with the slide 28 of ball slide 18 being coupled to the lead screw 24 as to convert the rotational movement of the motor into axial displacement. A variety of alternative electrical components might replace potentiometer 22, such as a linearly variable capacitor, a variable inductor, or the like. Rather than relying on an axial displacement of variable filter 12, the drive mechanism, support structure, and electrical component may effect and measure rotational displacement of a variable filter having a bandpass which varies along an arc. Regardless, the electrical component will preferably indicate the position of the filter, the component ideally providing an electrical signal which can be used in a electronic feedback control system for driving motor 21 so as to align the desired region of variable filter 12 in the optical path between the input and output fibers.

The wavelength resolution and repeatability of variable filter system 10 is largely determined by the measurement accuracy and repeatability of potentiometer 22. To a lesser degree the wavelength resolution and repeatability will also depend on the rate of change of the central wavelength along variable filter 12. Addressing the potentiometer accuracy and repeatability, potentiometer 22 typically has about 10 volts D.C. applied to the input connectors A and B. Assuming a reasonable measurement accuracy of about 1 millivolt at signal connector C, axial measurement resolution of a wiper having a half inch travel is about 1.27 μm. When using a potentiometer having a wiper travel of about 1 inch, the position measurement resolution is about 2.54 μm. Assuming a central wavelength change of about 1 nanometer per millimeter along the filter axis, the wavelength resolution related to the potentiometer measurement is around 0.002 nm or 2.5 pm. Although the actual resolution will be limited by a variety of other factors (including filter uniformity, incident angle variation, mechanical coupling accuracy, and the like), wavelength resolution remains quite good with this simple indirect electrical measurement system, ideally being less than 0.01 nm.

Figure 2:
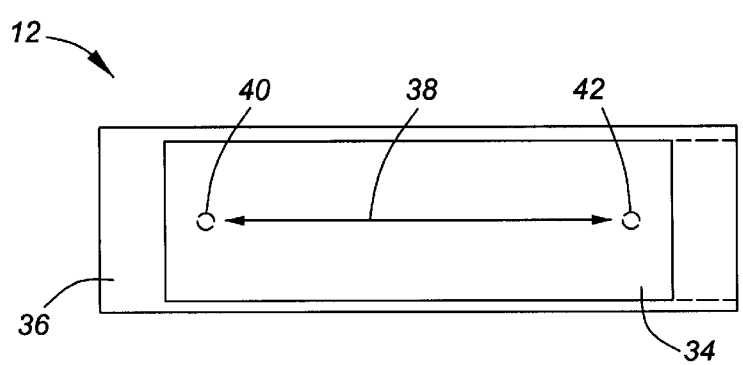
FIG. 2 illustrates an exemplary thin film filter structure having a coating thickness that varies along an axis.

Referring now to FIG. 2, variable filter 12 comprises a plurality of thin film coatings 34 disposed on a substrate 36. Coatings 34 may be deposited by a variety of coating methods, including chemical vapor deposition, plasma enhanced chemical vapor deposition, sputtering, and the like. Coatings 34 will have different indices of refractions, and the coating thicknesses will be selected so that the coatings will act as multi-cavity Fabry-Perot resonators. These coating layers will generally be deposited as quarter-wave thin film stacks separated by at least one spacer layer.

When using variable filter 12 as a bandpass filter, the central frequency of the pass bandwidth will generally be determined by the thickness of the spacer layers. Filtering effect can be enhanced by providing a plurality of spacing layers and associated quarter-wave thin film stacks having the appropriate local reference wavelength. Filter 12 may be disposed at an oblique angle to the incident light so that the reflected signal does not enter input fiber 14.

The exemplary variable filter 12 has a central wavelength which varies substantially linearly along an axis 38 from a low wavelength region 40 to a high wavelength region 42. To provide this change in wavelength response across the surface of variable filter 12, the spacer layers defining the cavities of the Fabry-Perot resonators will typically vary in thickness corresponding to the desired wavelengths, as can be easily calculated by those of skill in the art. Preferably, the quarter-wave thin film stack structures will also vary in thickness so that the central wavelength along axis 38 corresponds to the adjacent quarter-wave thin film stack structures.

Short wavelength region 40 and long wavelength region 42 will typically be separated by a linear distance of between about ¼" and 4'. A combined thickness of the substrate 36 and coatings 34 will preferably be less than about 1 mm, optionally being less than about 500 μm. Exemplary systems and methods for depositing thin film layer 34 are described in co-pending U.S. patent application Ser. No. 09/063,147, filed Apr. 20, 1998, the full disclosure of which is incorporated herein by reference. Alternative variable filter structures may be commercially available for other applications from Optical Coating Laboratory, Inc. of Santa Rosa, Calif. This supplier may also provide alternative variable filters having bandpass frequencies which vary along an arc, as described above.

Wavelength division multiplex optical communications system generally enhance the total amount of data which can be transmitted along an optical fiber by separating the data into discreet wavelength ranges. The total amount of data that can be transmitted is generally enhanced by increasing the wavelength "density" that is, by decreasing the spacing between the wavelength ranges. Increasing the density of wavelength multiplexed channels is facilitated by bandpass filters having narrow, well controlled pass ranges. Control of the pass range can be effected using the variable filter described above (by translating the filter so that a desired central wavelength is aligned with the optical path between input fiber 14 and output fiber 16). Multi-cavity thin film band pass filters having uniform coating thicknesses can generally provide fairly narrow bandpass ranges, and the efficiency of transmitting light through these thin film filters is often enhanced by radially expanding and collimating the optical signals with collimating lenses (such as GRIN lenses, aspheric lenses, or the like) adjacent the ends of the input and output fibers. However, where the central frequency of the bandpass range varies across the filter surface, distributing the optical signal across a larger region of the filter surface will result in a greater localized variation in the filter center wavelength. As an extreme example, assuming an optical signal were expanded and transmitted through the entire surface of coatings 34, one portion of the signal would pass through short pass region 40, while an alternate portion of the signal would be filtered by long pass region 42. A re-combined filtered signal would have a relatively wide pass range, and low transmission efficiency throughout that range.

To minimize variations in the central wavelength, it would generally be beneficial to limit the size of the aligned region of variable filter 12 disposed in the optical path between input fiber 14 and output fiber 16 at any given time. The effective bandwidth of filter system 10 will depend upon the point bandwidth of the filter (that is, the bandwidth of the thin film structure at a given point), the rate of change of the central wavelength across the filter surface (which might be measured in nm change in wavelength per millimeter distance along axis 38), the cross-sectional dimensions of the optical signal as incident upon the variable filter (for example, the spot diameter of the incident light), and the angular span of the incident light. This total effective bandwidth may be calculated by adding the point bandwidth to the product of the wavelength rate change times the signal spot diameter (for a circular signal cross-section) plus the bandwidth effects of the incident angle span.

To obtain the desired narrow bandwidth, it is generally beneficial to decrease the point bandwidth of variable filter 12, that is, the bandwidth of the thin film structure at each point. Additionally, minimizing both the rate of change of the wavelength and the light spot diameter will decrease the total variation in central wavelength of the optical signal. Unfortunately, reducing the rate of change of the wavelength will result in a smaller tuning range for a given linear length of the filter. Additionally, decreasing the diameter of the light spot often increases the angle span. Although the core of single mode optical fibers generally have diameters of less than 10 μm, the light exiting from an unaltered single mode fiber will have a relatively large dispersion angle. This will result in a relatively large angular span, as well as large insertion losses when light is delivered from one bare fiber to another bare fiber (unless the distance between the 2 fiber ends is no more than a few microns). It is for this reason that collimating lenses are often used to transmit optical signals between fibers. While standard GRIN lens collimators have quite good performance, and may be acceptable for certain variable filtered applications, the relatively large spot size and generally large dimensions and weight of these structures are significant drawbacks for the desired miniaturized components of dense wavelength division multiplex networks.

Figure 3:
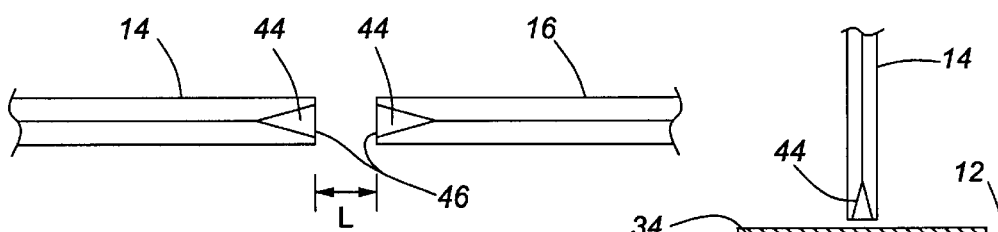
FIGS. 3–5 illustrate the structure and use of expanded fiber core lenses in the filtering system of FIG. 1.
Figure 4:
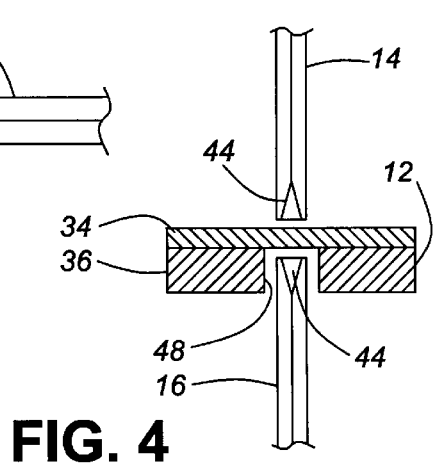

To enhance coupling efficiency while minimizing bandwidth spread, the optical signals will preferably be transmitted by lenses having a cross sectional dimension which is not substantially larger than that of at least one of the single mode optical fibers. Referring now to FIGS. 3 and 4, core expanded single mode fibers have radially expanded cores 44 near their ends 46. These expanded cores act as collimating lenses, and as their outer diameters are the same as the adjacent single mode fiber, they are very suitable for miniaturized fiber optic devices. As the cores and transmitted light remain within the cladding diameter (typically being about 125 μm), tapered cores 44 produce a quite small spot size.

Figure 5:
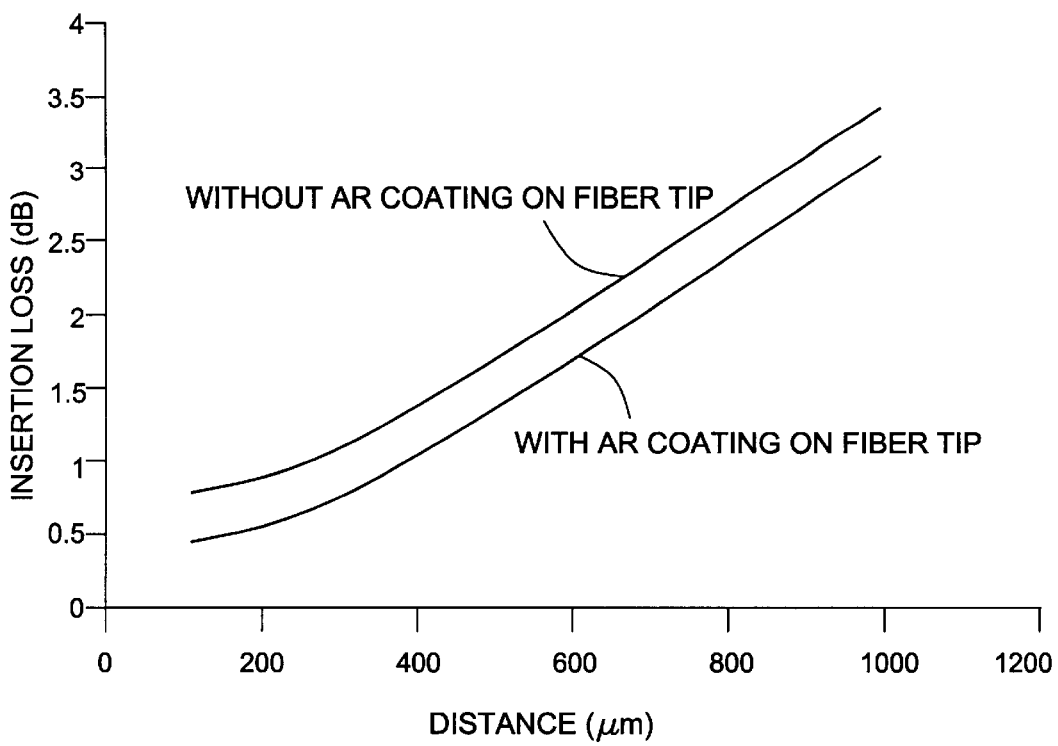

Referring now to FIGS. 4 and 5, one disadvantage of core tapered single mode fibers is the sensitivity of the transmission system to insertion losses with increasing distance in fiber end separation. These insertion losses can generally be minimized by decreasing the thickness of variable filter 12. To provide sufficient structural integrity to variable filter 12 while maintaining an acceptable insertion loss, substrate 36 may include a channel 48. Channel 48 will generally extend along filter axis 38, thereby allowing the filter to move while one of the fibers extends into the channel. Substrate 36 may be formed as separate parts bonded together, or channel 48 may be formed in a unitary substrate before or after coatings 34 have been deposited.

In general, to keep insertion losses to a acceptable levels, ends 46 of single mode optical fibers having tapered cores will preferably be separated by a distance L of no more than 1000 μm, the distance being preferably less than 500 μm. As can be seen in FIG. 5, anti-reflective coating on the fiber tips will significantly reduce insertion losses.

Figure 6:
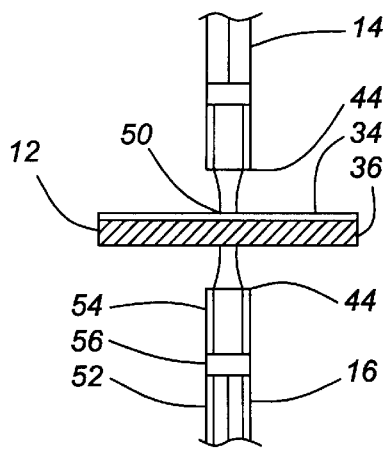
FIGS. 6 and 7 illustrate alternative lens structures, in which a length of multi-mode GRIN fiber focuses the optical signals toward, or receives the optical signals from, a waist adjacent the filter coatings so as to minimize variations in the central wavelength of the filtering system of FIG. 1.
Figure 7:
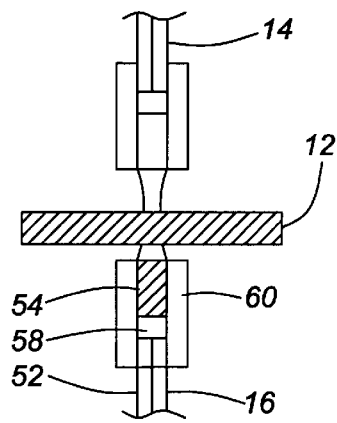

Still further alternative fiber lens structures are illustrated in FIGS. 6 and 7. These structures generally comprise a length of multi-mode fiber in the optical path of signals between single mode input and output fibers 14, 16. The multi-mode fiber has properties and lengths selected so that optical signals transmitted therethrough are focused to a waist 50. Advantageously, light is generally transmitted from single mode fibers as a Gaussian beam. When focusing a Gaussian beam, the divergence angle produced adjacent the beam waist is relatively small. These properties help minimize the beam size at coatings 34 (generally decreasing the cross-sectional dimensions of the beam, and particularly the span of the beam along filter axis 38, at the active filtering structure), and its potentially deleterious effect on total effective bandwidths for the filter system. Waist 50 will preferably be disposed adjacent coatings 34 of variable filter 12. It should be noted that this may involve offsetting filter 12 as shown, so that substrate 36 is significantly closer to one end 44.

To focus the optical signals from a single mode fiber 52 toward a waist 50 (and/or to focus the transmitted optical signals from the waist into the core of the output fiber) a multi-mode GRIN fiber 54 is positioned co-axial with, but preferably separated from, the single mode fiber. To maintain the separation distance between the GRIN and single mode fibers, a step index multi-mode fiber 56 may optionally be disposed therebetween, as illustrated in FIG. 6. Alternatively, an air gap 58 may be disposed between the GRIN and single mode fibers, with the co-axially alignment being maintained by a ferule 60, as illustrated in FIG. 7.

Figure 8:
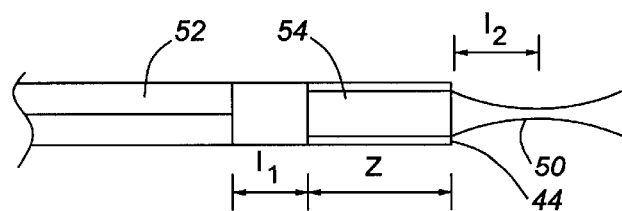
FIGS. 8 and 9 schematically illustrate the dimensions of the fiber-based lenses of FIGS. 6 and 7.
Figure 9:
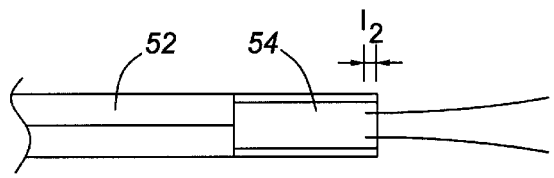

Calculation of appropriate multi-mode fiber lengths for the lens systems of FIGS. 6 and 7 can be understood with reference to FIGS. 8 and 9. Where capital Z is the length of the GRIN multi-mode fiber, and where l1 is the gap between GRIN fiber 54 and single-mode fiber 52, we can calculate the distance between end 44 of the fiber system and waist 50 from the refractive index of the single-mode fiber core $N_0$, the refractive index in the gap between the single mode and GRIN fibers $N_1$ (which may be the refractive index of the air gap, the refractive index of the core of a step multi-mode fiber, or the like), and the squared gradient constant of the GRIN fiber A as follows:

$$l_2 = \frac{(-N_1/\sqrt{A})\sin(Z\sqrt{A}) - N_0 l_1 \cos(Z\sqrt{A})}{N_1 N_0 \cos(Z\sqrt{A}) - N_0^2 \sqrt{A}\, l_1 \sin(Z\sqrt{A})}$$

In the particular case where single mode fiber 52 is in contact with GRIN fiber 54, that is, where $l_2$ is equal to 0 as illustrated in FIG. 9, this indicates the following:

$$l_2 = \frac{(-N_2/\sqrt{A})\sin(Z\sqrt{A})}{N_0 \cos(Z\sqrt{A})}$$

Where $$\frac{\sin(Z\sqrt{A})}{\cos(Z\sqrt{A})} < 0,$$

and hence where Z is an integer multiple of a pitch length P of GRIN fiber 54, plus between one-half and one-quarter pitch, or plus between one and three-quarter pitch (½P>Z>¼P; P>Z>¾P), $l_2$ may be greater than 0, so that the waist is disposed beyond end 44.

Otherwise, $l_2$ may be less than zero, and the waist will be disposed within the GRIN fiber, as illustrated in FIG. 9. This indicates that when there is no gap between the single mode and multi-mode fibers, the optical signal will often be expanding, likely resulting in losses when the input and output optical fibers are separated by variable filter 12.

To avoid divergence of the optical signal, we provide a separation distance between the single mode and multi-mode fibers (12 greater than 0) by setting:

$$l_1 > \frac{N_1 \cos(Z\sqrt{A})}{N_0 \sqrt{A}\, \sin(ZA)}.$$

Figure 10:
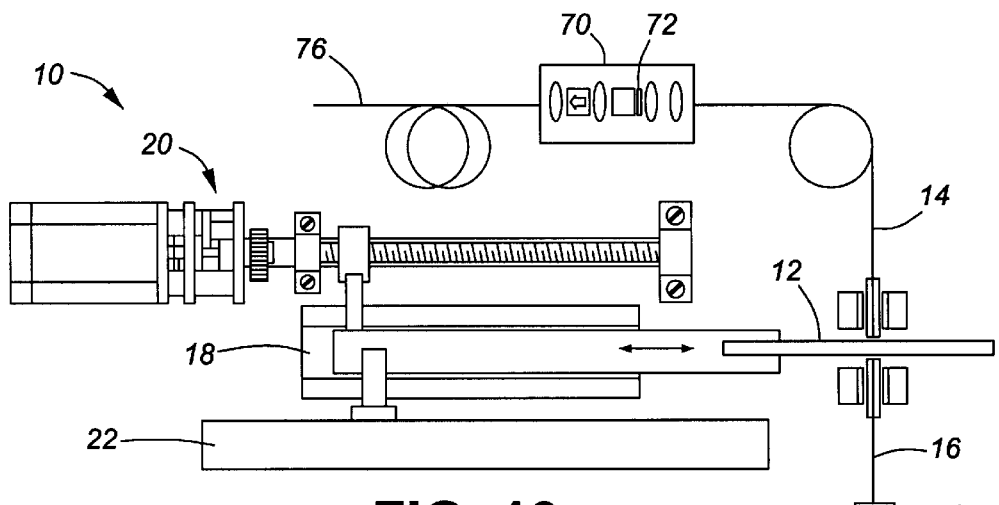
FIGS. 10, 10A and 11 illustrate tunable laser sources according to the principles of the present invention.
Figure 11:
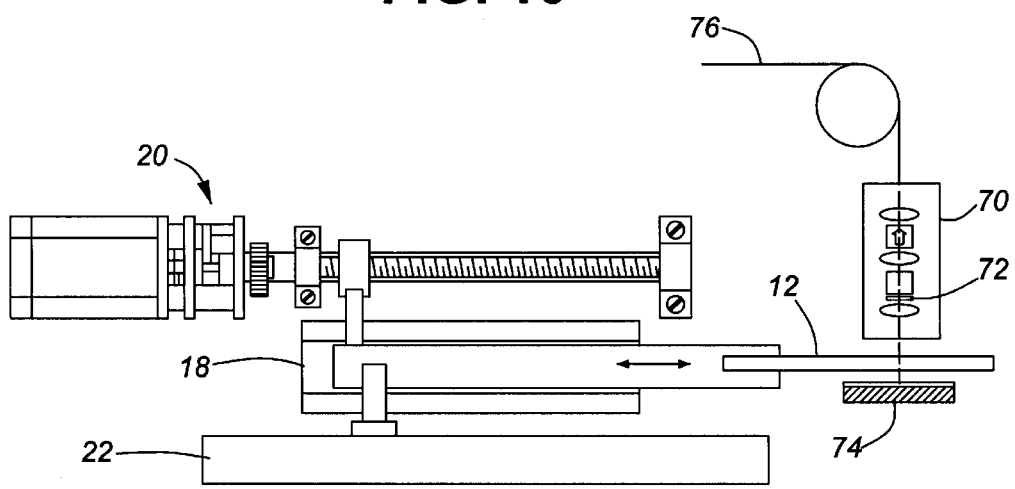
Figure 10A:
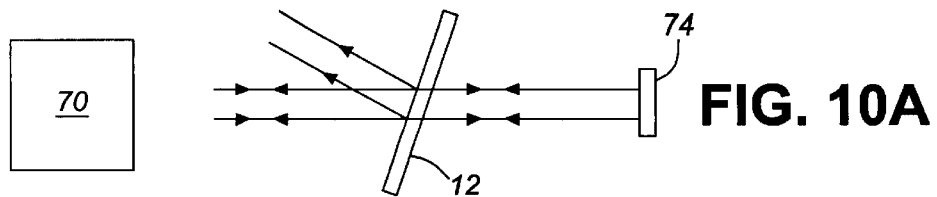

Tunable laser sources including the variable filter systems of the present invention are illustrated in FIGS. 10 and 11. A Fabry-Perot laser diode chip 70 includes an internal cavity having one end face treated with anti-reflective coating 72. This allows light generated within the internal laser cavity to be refracted and filtered by variable filter 12. This light energy may optionally be transmitted toward the filter by input fiber 14 as illustrated in FIG. 10, or directly from the laser diode structure as illustrated in FIG. 11. Filter 12 may be disposed at an oblique angle relative to incident light from laser diode 70, so that light which is outside the pass bandwith of the filter is reflected by the filter out of the external cavity and away from the laser diode, as illustrated in FIG. 10A. For example, filter 12 may have a surface defining a tilt angle of about 8° from a normal to the incident light from laser diode 70. A mirror or other reflective device 74 directs the filtered light back into the internal cavity of laser diode 70, so that mirror 74 defines one end of an external cavity of the laser system. Varying the external cavity structure by moving variable filter 12 with filter moving mechanism 20 changes the resonant frequency of the laser, and hence the wavelength of the laser output 76.

Figure 12:
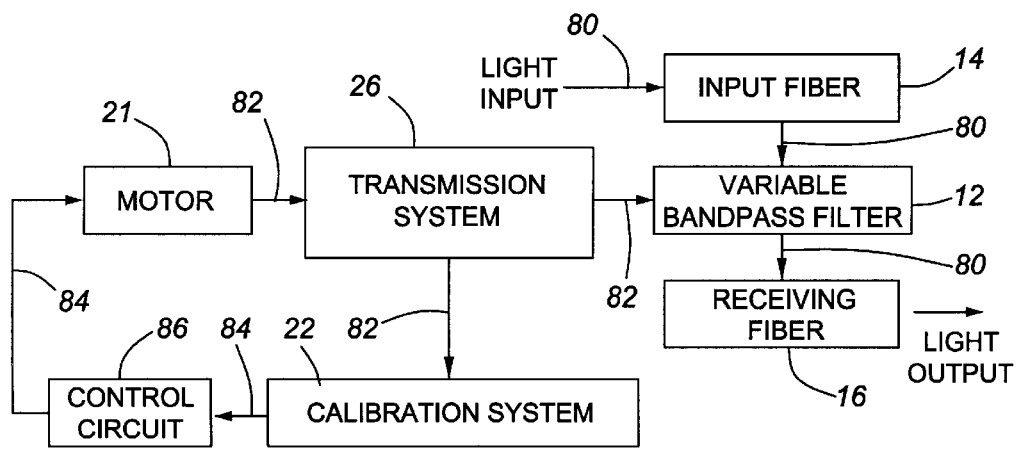
FIG. 12 is a functional block diagram illustrating the working principle and method of use of a tunable filter system.

FIG. 12 schematically illustrates a light frequency control system including the filter system of the present invention. The optical signals 80 will optionally travel along input and/or output fibers to and from variable bandpass filter 12, or may alternatively be transmitted directly toward the filter with an external laser cavity arrangement. Mechanical connections 82 couple the motor, gear drive and other components of the mechanical transmission system, and variable bandpass filter 12 to each other and to potentiometer 22. Electrical signal from potentiometer 22, together with a motor drive signal, provide a data link 84 for use in a feedback control loop under the direction of a processor 86.

Figure 13:
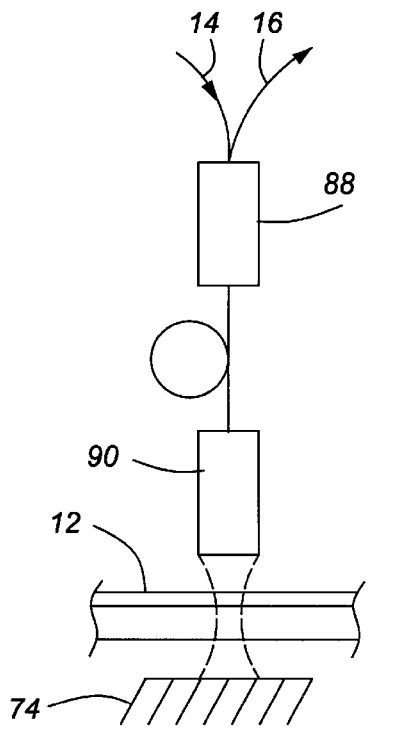
FIG. 13 schematically illustrates a variable filtering system in which the optical signals are transmitted through a collimating or focusing lens between an optical fiber and the filter, and are reflected back through the filter and the lens by a reflector.

As can be understood with reference to FIG. 13 still further arrangements are possible. For example, the input and output fibers may be coupled together by a coupler or circulator 88, with the resulting signals being directed to and from reflector 74 by a lens structure 90 (which may include any of the fiber based structures described above). It should be noted that reflector 74 may optionally be contoured to efficiently reflect the optical signal toward a waist at the filter coatings, and then into collimator or focusing lens structure 90. In alternative embodiments, a variable neutral filter might replace the wavelength variable filter, allowing the filter system 10 to operate as a variable attenuator with high resolution. A related device is described in copending U.S. patent application Ser. No. 08/884,880, filed Jun. 30, 1997, the full disclosure of which is incorporated herein by reference.

The exemplary embodiments have been described above in some detail, by way of example and for clarity of understanding. Nonetheless, a variety of adaptations, modifications, and changes will be obvious to those skilled in the art. Therefore, the present invention is limited solely by the appended claims.

What is claimed is:

1. A device for varying a wavelength of an optical signal, the device comprising:
    a first optical fiber disposed along an optical path;
    an optical filter disposed across the optical path, the filter selectively transmitting signals within a pass wavelength range, the pass range of the filter varying from a first pass range at a first region of the filter to a second pass range at a second region of the filter;
    a filter moving mechanism coupled to the filter so that an aligned region of the filter moves in the optical path between the first and second regions, the aligned filter having an effective pass wavelength range; and
    an electrical component coupled to the mechanism so as to indicate the effective pass wavelength range.

2. The device of claim 1, wherein the filter defines a filter axis between the first region and the second region, the pass range of the filter varying substantially linearly along the filter axis.

3. The device of claim 2, wherein the mechanism comprises threads having an axis and a body engaging the threads so that a position of the body along the thread axis varies during relative rotation between the body and the threads.

4. The device of claim 3, further comprising a motor drivingly engaging a structure selected from the group consisting of the threads and the body so as to effect the relative rotation.

5. The device of claim 4, wherein the optical filter is supported by a slide of a linear ball slide, the slide being coupled to the mechanism.

6. The device of claim 1, wherein the electrical component has an electrical characteristic, the electrical characteristic varying as the mechanism moves the aligned filter region so that the electrical characteristic provides an absolute signal indicating the effective pass wavelength range.

7. The device of claim 6, wherein the electrical component comprises a potentiometer, the mechanism moving a wiper of the potentiometer relative to a body of the potentiometer when the mechanism moves the aligned filter region.

8. The device of claim 1, wherein a lens is disposed adjacent an end of the first fiber, the lens focussing the optical signal to a waist adjacent thin film coatings of the filter.

9. The device of claim 8, wherein the first fiber has a fiber diameter, and wherein the lens has a diameter substantially equal to the fiber diameter.

10. The device of claim 9, further comprising a second fiber having an end with a lens disposed adjacent an end of the second fiber, the filter disposed between the ends of the first fiber and the second fiber, wherein the lenses comprise structures selected from the group consisting of an expanded core of the input fiber and a first length of GRIN fiber separated from the end of the input fiber by a separation distance.

11. The device of claim 1, further comprising a reflector and a laser diode disposed along the optical path, the laser diode having a cavity with a first end oriented along the optical path toward the first fiber and a second end oriented along the optical path toward the filter, wherein the filter is disposed between the laser diode and the reflector along the optical path.

12. A device for varying a wavelength of an optical signal, the device comprising:

an input optical fiber for transmitting the optical signal, the input fiber having an end;

an optical filter in the optical path of the optical signal, the filter selectively passing a portion of the optical signal;

an output fiber in the optical path of the passed portion of the optical signal; and at least one lens in the optical path between the input fiber and the output fiber, the at least one lens having a diameter not substantially larger than the diameter of the input fiber and the output fiber, wherein the optical filter selectively transmits the signals within a pass wavelength range, the pass range of the filter varying from a first pass range at a first region of the filter to a second pass range at a second region of the filter.

13. A device as claimed in claim 12, wherein the lens comprises a first expanded fiber core adjacent the end of the input fiber, and further comprising a second expanded fiber core adjacent the end of the output fiber, the first and second expanded cores being separated by a distance of less than 1 mm.

14. A device as claimed in claim 12, wherein the lens comprises a length of multi-mode fiber which focusses the optical signals to a waist adjacent the filter so as to enhance the pass range uniformity across the optical signal, the input fiber and the output fiber comprising single mode fibers.

15. A device as claimed in claim 12, wherein the multi-mode fiber comprises a multi-mode GRIN fiber.

16. A device as claimed in claim 15, further comprising a multi-mode step index fiber disposed between the GRIN fiber and the single mode fiber.

17. A device as claimed in claim 12, wherein a first lens adjacent the input fiber focusses the optical signal to a waist, wherein a second lens adjacent the output fiber focusses the passed portion of the optical signal into the output fiber, and wherein the filter is disposed adjacent the waist.

18. An optical device comprising:

first and second optical fibers having ends disposed along an optical path, the ends separated by a distance;

a thin film optical element disposed across the optical path between the ends of the optical fibers; and a substrate supporting the thin film optical element, the substrate having an opening, the opening receiving the end of the first optical fiber so as to diminish the separation distance.

19. The optical device of claim 18, wherein the thin film optical element and the substrate beyond the opening have a total thickness, and wherein the separation distance is less than the total thickness.

20. The optical device of claim 18, wherein the optical element has an optical characteristic which varies along an axis, wherein the opening comprises a channel extending along the axis, and wherein the optical element is movable axially so as to vary the optical characteristic of a signal transmitted between the ends of the optical fiber.

21. The optical device of claim 20, wherein the optical element comprises a thin film bandpass filter.

22. The optical device of claim 18, wherein the end of the optical fibers have locally expanded cores so as to enhance transmission efficiency.

23. The device of claim 1, wherein:

the first optical fiber is a single mode optical fiber having an end, the device further comprising:

a lens disposed coaxially with the single mode fiber, the lens comprising a length of multi-mode fiber such that any signals transmitted from the fiber and through the lens are focussed toward a waist beyond the lens.

24. The device of claim 23, wherein the multi-mode fiber comprises a GRIN multi-mode fiber.

25. The device of claim 24, wherein the GRIN fiber is separated from the single mode fiber.

26. The device of claim 25, further comprising a multi-mode step index fiber disposed between the GRIN fiber and the single mode fiber end.

* * * * *